US005875632A

United States Patent [19]

Kappel et al.

[11] Patent Number: 5,875,632

[45] Date of Patent: Mar. 2, 1999

[54] ELECTROHYDRAULIC DRIVE

[75] Inventors: Andreas Kappel; Randolf Mock, both of München, Germany

[73] Assignee: Siemens Aktiengesellschaft, Munich, Germany

[21] Appl. No.: 849,565

[22] PCT Filed: Nov. 30, 1995

[86] PCT No.: PCT/DE95/01702

§ 371 Date: May 30, 1997

§ 102(e) Date: May 30, 1997

[87] PCT Pub. No.: WO96/17165

PCT Pub. Date: Jun. 6, 1996

[30] Foreign Application Priority Data

Nov. 30, 1994 [DE] Germany .......................... 44 42 649.6

[51] Int. Cl.$^{6}$ .......................... F15B 21/08; F02M 51/06; H01L 41/09

[52] U.S. Cl. .............................. 60/583; 60/545; 310/328

[58] Field of Search ...................... 60/545, 583; 310/328

[56] References Cited

U.S. PATENT DOCUMENTS

| | | | |
|---|---|---|---|
| 3,635,016 | 1/1972 | Benson | 60/583 |
| 5,233,834 | 8/1993 | Tsukamoto | 60/545 |

FOREIGN PATENT DOCUMENTS

| | | |
|---|---|---|
| 2711393 C2 | 9/1978 | Germany . |
| 4005774 A1 | 8/1991 | Germany . |
| 4306073C1 | 6/1994 | Germany . |
| 4406522C1 | 7/1995 | Germany . |

*Primary Examiner*—Sheldon J. Richter

*Attorney, Agent, or Firm*—Hill & Simpson

[57] ABSTRACT

An electrohydraulic drive is provided. High-speed injection valves of hydraulic lift transformers have, for example, a pressure piston driven by a piezoelectric actuator and a reciprocating piston mounted in an axially displaceable fashion in a pressure piston bore and connected to the valve needle. The electrohydraulic drive has a piezoelectric actuator and a hydraulic force/travel transmission of compact design. To ensure the required axial symmetry of the drive despite production-induced tolerances, a balance element supported in a frustoconical depression of the pressure piston is arranged between the piezoelectric actuator and the lift transformer. During assembly of the hydraulics, the element having the form of a spherical segment and produced from high-grade steel can slide freely on the piezoceramic and thus compensate a nonconcentric alignment of the actuator and pressure piston. The ability to rotate freely inside the abutment ensures that the upper part of the actuator always bears with the full surface contact against the pressure piston.

11 Claims, 2 Drawing Sheets

ELECTROHYDRAULIC DRIVE

BACKGROUND OF THE INVENTION

An injection valve is generally known from German Patent No. DE4306073 C1 that contains a drive having a of compact design and also having very good dynamic properties that still operates reliably even at high operating frequencies (f>1 kHz). Since the drive permits valve opening and closing times in the range of $\tau \leqq 0.1$ ms, it is possible to inject even the smallest fuel quantities into the combustion chamber of an engine in a precisely metered and reproducible fashion. The main components of the drive are a piezoelectric actuator, which generates the primary operating travel, and a hydraulic lift transformer which essentially has a pressure piston driven by the piezoelectric actuator and a reciprocating piston which is mounted in an axially displaceable fashion in a pressure piston bore and is connected to the valve needle. The piezoelectric actuator arranged in one of the hydraulic chambers is supported on the housing side on a spherical cap bearing. This measure ensures that the actuator always bears with full surface contact against the pressure piston even should its end surfaces are not parallel for production reasons, and that no loss of lift occurs.

The design of this known valve places high demands on the axial symmetry and dimensional accuracy of the individual components. In particular, the multiply guided reciprocating piston must be produced accurately down to a few $\mu$m in order to prevent canting or jamming. This complicates mass production and makes production of the valve substantially more expensive.

SUMMARY OF THE INVENTION

It is, therefore, an advantage of the present to provide an operationally reliable electrohydraulic drive which has a compact design, operates within a large temperature range and has good dynamic properties. To this end, in an embodiment, an electrohydraulic drive is provided having an actuator and a lift transformer arranged in a housing filled with a hydraulic medium. The length of the actuator varies in a controllable fashion. A first piston is arranged in an axially displaceable fashion in a housing bore. A second piston acts on a spring element and a control element wherein the first piston is driven by the actuator. The first piston has an axial bore in which the second piston moves in an opposite direction to the first piston. A balancing element is arranged between the actuator and the lift transformer wherein the balancing element is formed of a spherical segment and is supported in an actuator side depression of the first piston and is capable of sliding freely on the actuator.

The advantage which can be achieved with the present invention consists, in particular, in that even a comparatively large decentering of one of the multiply guided parts does not impair the functionality of the drive. The drive can, therefore be, produced with a substantially lower outlay and in a more cost effective fashion.

BRIEF DESCRIPTION OF THE DRAWINGS

Additional features and advantages of the present invention are described in, and will be apparent from, the detailed description of the presently preferred embodiments and from the drawings.

DETAILED DESCRIPTION OF THE PRESENTLY PREFERRED EMBODIMENTS

The design and method of functioning of the electrohydraulic drive will be described in conjunction and with reference to FIGS. 1 and 2 wherein like numerals refer to like parts.

Figure 1:
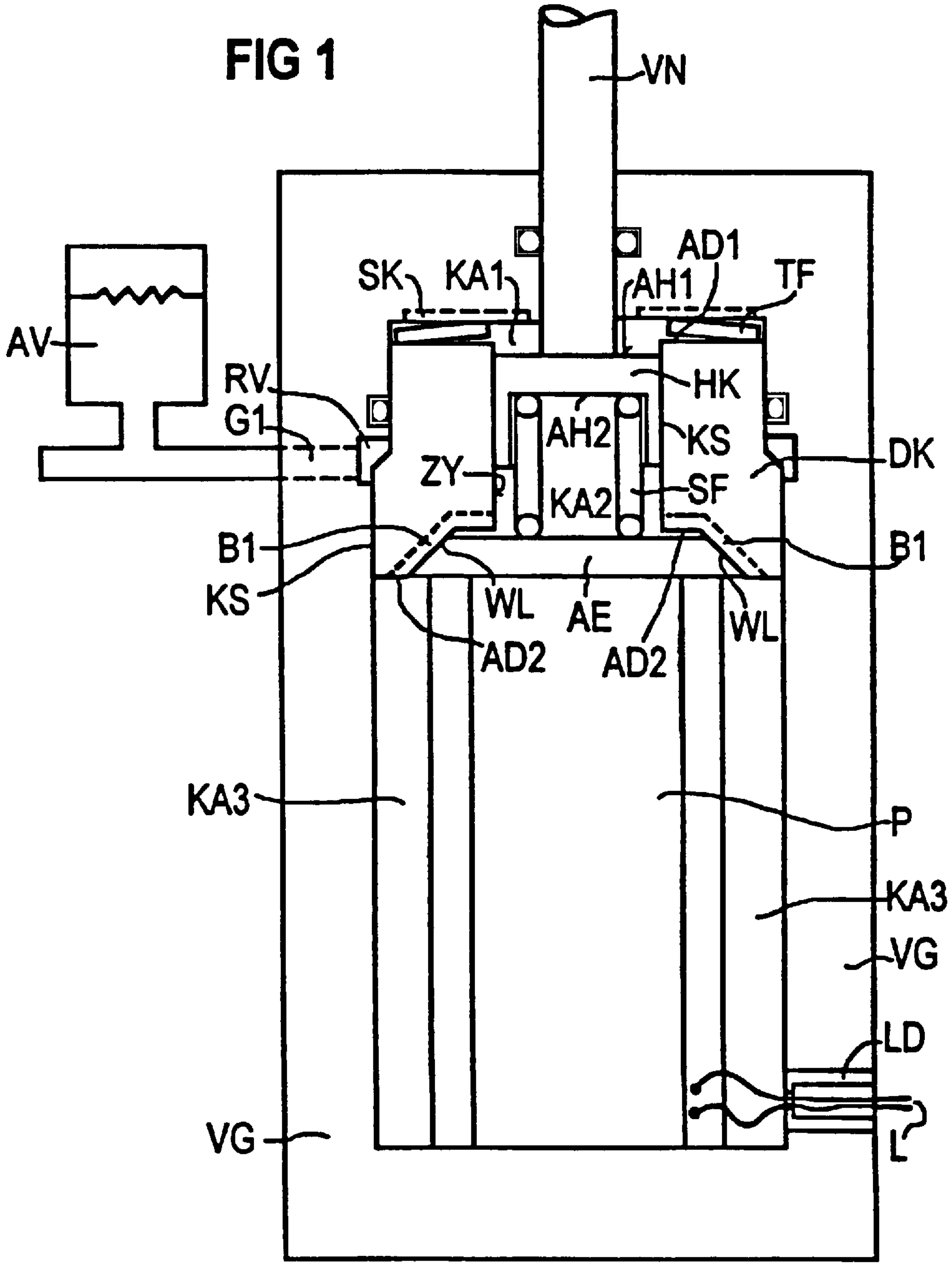
FIG. 1 illustrates a sectional view of an embodiment of an electrohydraulic drive for a fuel injection valve.

FIG. 1 shows essentially only the components of a high-speed fuel injection valve which relate to the drive according to the invention; such a valve is disclosed for example, in German Patent No. DE 43 06 073 C1 or described in more detail in the German Patent Application DE 4406522. As drive element, the injection valve contains an electromechanical actuator P which acts on a hydraulic lift transformer DK/HK and which is supplied with the required operating voltages via a pressure-tight housing bushing LD. Particular consideration is given as the electromechanical actuator P to a piezoelectric multilayer stack which still generates comparatively large primary lifts even in the case of moderate operating voltages (relative changes in length $\Delta l/l \approx 1 \times 10^{-3}$; drive force $F = 10^2$ to $10^5$N)

Because of the high mechanical stiffness of the piezoelectric sintered body, its electromechanical resonance is in the range of about 10 to 1000 kHz, with the result that it is possible in principle to achieve response times of about 0.001 to 0.1 ms. The response times realized in practice are, however, longer and depend, inter alia, on the electrical activation and wiring of the piezoelectric stack, as well as on the size of the masses driven by the actuator P. Since the electrical capacitance of the piezoelectric stack is typically in the range of about $C_p = 1$ to 100 $\mu$F, and the internal resistance of the voltage source assigned to the actuator is about $R_i = 1\Omega$, values of about $\tau = 1$ to 100 $\mu$s result for the charging time constant defined by $\tau = C_p \times R_i$. The response times of the piezoelectric actuator P are thus 1 to 2 orders of magnitude below those of comparable electromagnetic drives, and, in conjunction with a compact valve design and small moving masses, this permits extremely short valve opening and closing times.

In order to initiate the injection of the fuel into the combustion chamber of the engine, the actuator P is activated and thereby elongated in the axial direction. The change in length $\Delta l$ of the actuator P is attended by a corresponding upward displacement of the pressure piston DK, which is mounted with a clearance fit in a cylindrical bore of the housing VG, with the result that an overpressure $p_1$ is built up in the chamber KA1 filled with hydraulic oil, and an underpressure $p_{2/3} < p_1$ is built up in the chambers KA2 and KA3, which are like-wise filled with hydraulic oil and are connected to one another in terms of fluid flow by a pressure piston bore B1. As soon as the hydraulic forces proportional to the pressure difference $\Delta p = p_1 - p_{2/3}$ exceed a value dependent on the stiffness and biasing of the helical spring SF arranged in the chamber KA2, the pot-shaped reciprocating piston HK moves downward in the cylindrical pressure piston bore ZY and thereby lifts the valve needle VN, which is connected to it, from the sealing fit, and the injection operation begins.

The fuel injection is terminated by the electrical discharge of the piezoelectric actuator P. Because of the attendant contraction of the actuator P, the pressure piston DK moves back downward into its initial position under the compulsion of the restoring force exerted by a strong disk spring TF.

Supported by the helical spring SF and the pressure difference existing between the chambers KA1 and KA2/KA3, the reciprocating piston HK carries out a movement upward in the opposite direction, with the result that the valve needle VN, which is guided in a sealed fashion out of the housing VG, sinks onto the sealing fit and seals the injection opening.

The transient mode of operation of the drive necessitates mechanically prestressing the piezoelectric actuator P. The force required for this is generated by the disk spring TF which is arranged in the chamber KA1 and which also supports the return of the pressure piston DK to its neutral position. Flow channels SK in the chamber ensure unhindered inflow and outflow of the hydraulic oil into and from the volume enclosed by the disk spring TF and the valve housing VG.

In order to guarantee the required axial symmetry of the system of the primary drive and force/travel transmission despite production-induced tolerances, a balancing element AE supported in a frustoconical depression WL of the pressure piston DK is arranged between the piezoelectric actuator P and the lift transformer. The balancing element AE, which has a form of a spherical segment, preferably consists of high-grade steel or a nickel-chromium-steel. Because of its polished surfaces, the balancing element AE can slide freely on the piezoceramic during the assembly of the hydraulics, and thus compensate a nonconcentric alignment of the actuator P and pressure piston DK. The freedom of the balancing element AE to rotate inside the conical abutment WL ensures, furthermore, that the upper part of the piezoelectric actuator P, which is mounted securely in terms of rotation on the bottom of the housing, always bears with full surface contact against the pressure piston DK. The disk spring DF, which mechanically prestresses the piezoelectric actuator P, ensures the force-closed contact of the parts with one another.

The force/travel transmission driven by the actuator P comprises two coupled hydraulic transformers, wherein the transmission ratio $\eta_1$ of the upper lift transformer is given by $$\eta_1 = AD1/AH1 \tag{1}$$

wherein

AD1 is area of the pressure piston top side and

AH1 is area of the reciprocating piston top side;

and the transmission ratio $\eta_2$ of the lower lift transformer is given by:

$$\eta_2 = AD2/AH2 \tag{2}$$

wherein

AD2 is actuator-side pressure piston area and

AH2 is actuator-side reciprocating piston area

Equation (2) holds, however, only under the precondition that the actuator P arranged in the hydraulic chamber KA3 has the same volume in the elongated and discharged states. Like the piezoelectric stack P which is used, electrostrictive and magnetostrictive actuators also display such a behavior to a good approximation.

If the actuator P experiences a change in volume $\Delta V$ proportional to the change in length $\Delta l$, it can be assigned the effectively active actuator area $AP := \Delta V/\Delta l$. In this case, the transmission ratio $\eta_2'$ of the lower lift transformer is given by:

$$\eta_2' := (AD2 - AP)/AH2 \tag{3}$$

In the ideal case, the upper and lower lift transmission ratio should be identical ($\eta_1 = \eta_2 = \eta$), and this can be achieved directly by an appropriate design of the pressure-active end faces of the two pistons DK, HK. Thus, the pressure piston DK of the force/travel transmission represented in FIG. 1 is of stepped design (AD1<AD2), in order to take account of the inequality, caused by the valve needle, between the pressure-active reciprocating piston areas AH1<AH2.

It is a consequence of the hydraulic coupling of the two lift transformers that for every change in length of the actuator P, complementary pressures build up in the chambers KA1 and KA2/KA3. A displacement of the pressure piston DK by $\Delta l$ causes causing a displacement of the reciprocating piston HK in the pressure piston bore ZY which is in the opposite direction and is enlarged in accordance with the hydraulic transmission ratio $\eta >> 1$.

In order to ensure that the drive is largely independent of temperature, the hydraulic chambers KA1, KA2, KA3 are connected, both via one another and via the capillary gap KS present between the pistons DK, HK and the corresponding cylinder bores, to a balancing volume AV which is at overpressure. Temperature-induced changes in volume of the hydraulic oil can therefore lead neither to the formation of static pressure differences between the chambers KA1 and KA2/KA3 (this would result in undefined positions of the reciprocating piston HK), nor to the formation of undefined pressure states in the entire system. The connection, effected via the housing bore G1, of the annular chamber RV to the balancing volume AV has, furthermore, the advantage that no cavitation reducing the maximum operating frequency occurs in the hydraulic oil.

By adapting the flow resistances of the capillary gaps to the viscosity of the hydraulic oil employed, it can be ensured that in the relevant working temperature range the valve blocks at the frequency prescribed by the activating signal and for the desired period. In order to set a large flow resistance, it can be recommended, for example, to provide the bore G1 in the region of the pressure piston sealing surface. However, it can in principle, also be fitted in any other region of the valve housing VG provided that flow resistances in the form of orifices, gaps, throttles, constrictions etc. ensure that only comparatively slow balancing processes take place between the various volumes and chambers. The chambers are, if appropriate, to be sealed with respect to one another to such an extent that the required blocking times are reached and it continues to be ensured that the drive is independent of temperature. A temperature-dependent control of the gap flows is possible if the valve housing VG and the built-in components (pressure piston DK, reciprocating piston HK) are produced from materials having different coefficients of thermal volumetric/linear expansion. It can be achieved thereby that the gap widths reduce with increasing temperature, and this correspondingly increases the flow resistance. Temperature-controlled flow resistances can, of course, also be produced as discrete components and be built into the corresponding bores G3 or supply lines.

The drive according to the invention has a range of advantages. Thus, the drive permits symmetric, cavitation-free switching with very short switching times, extremely short dead times and high operating frequencies. Furthermore, because of its comparatively simple and compact design and of the large range of operating temperatures, the drive is distinguished by a high operational reliability. This is also aided by the fact that the actuator P is hermetically encapsulated in one of the hydraulic chambers KA3. Good dissipation of the heat generated, and optimum protection against environmental influences are thereby ensured. The drive is also largely sealed, since the electric connections L of the actuator P are led outward through a pressure-tight, electrically insulating element LD.

Figure 2:
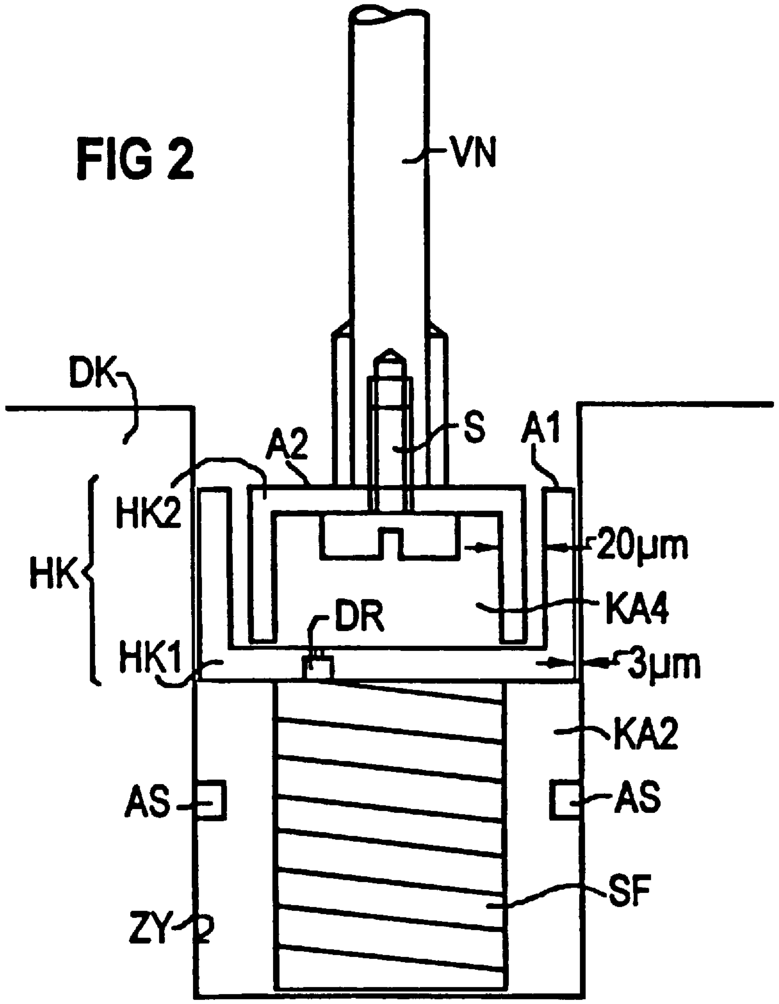
FIG. 2 illustrates a sectional view of an embodiment of a bipartite reciprocating piston of the force/travel transmission drawn.

The reciprocating piston of the force/travel transmission represented in FIG. 2 has two parts HK1, HK2. The outer part HK1 is formed in the shape of a pot, is open on the valve needle side and rests on the spring SF, being guided with a closer tolerance in the pressure piston bore ZY. Supported herein is the inner reciprocating piston part HK2, which is likewise pot-shaped and open on the actuator side. A screw S connects the inner part HK2, which can be displaced transverse to the direction of lift, to the valve needle VN. Both parts can also be soldered or welded.

The horizontal displaceability of the inner reciprocating piston part with respect to the outer one guided in the bore ZY ensures that an eccentricity present in the pressure piston/reciprocating piston system is largely compensated. In the non-actuated state, spring SF arranged in the chamber KA2 ensures force-closed contact between the two reciprocating piston parts HK1/2. The valve needle VN is supported on the valve seat. The force-closed contact is maintained even in the event of deflection of the pressure piston DK, since the hydraulic oil exerts a larger force on the inner part HK2 than on the annular surface A1 ($A_2>A_1$) assigned to the outer part HK1. The two stops denoted by AS limit the downward deflection of the outer reciprocating piston part AK2. A throttle DR present on the bottom of the outer reciprocating piston part HK1 renders it possible to exchange fluid between the two chambers KA2/KA4 as previously set forth.

Furthermore, it should also be understood that other various changes and modifications to the presently preferred embodiments described herein will be apparent to those skilled in the art. Such changes and modifications may be made without departing from the spirit and scope of the present invention and without diminishing its attendant advantages. Therefore, it is intended that such changes and modifications be covered by the appended claims.

We claim:

1. An electrohydraulic drive comprising:

an actuator and a lift transformer arranged in a housing filled with a hydraulic medium wherein length of the actuator varies in a controllable fashion;

a first piston arranged in an axially displacebale fashion in a housing bore and a second piston which acts on a spring element and a control element wherein the first piston is driven by the actuator and has an axial bore in which the second piston moves in an opposite direction to the first piston; and a balancing element arranged between the actuator and the lift transformer wherein the balancing element is formed of a spherical segment and is supported in an actuator-side depression of the first piston and is capable of sliding freely on the actuator.

2. The electrohydraulic drive according to claim 1 further comprising:

a depression tapering in the direction of the second piston.

3. The electrohydraulic drive according to claim 2 wherein the depression is frustroconically shaped.

4. The electrohydraulic drive according to claim 2 wherein the depression opens into the axial bore of the first piston.

5. The electrohydraulic drive according to claim 1 further comprising:

a first hydraulic chamber formed by the second piston wherein the axial bore and the balancing element are in fluid communication with a second hydraulic chamber which accommodates the actuator.

6. The electrohydraulic drive according to claim 1 wherein the first piston has a stepped design.

7. The electrohydraulic drive according to claim 1 wherein the spring element is arranged in the first hydraulic chamber.

8. The electrohydraulic drive according to claim 1 further comprising:

a pot-shaped first part open in the direction of the control element; and a pot-shaped second part open on the actuator side wherein the second part acts on the control element and is arranged in a force-closed fashion on a bottom of the first part such that the second part can be displaced transverse to the direction of lift.

9. The electrohydraulic drive according to claim 8 wherein a pot-shaped end of the control element forms the second part of the second piston.

10. The electrohydraulic drive according to claim 8 wherein the second part is screwed or soldered to the control element.

11. The electrohydraulic drive according to claim 8 wherein the first part has a bore acting as a throttle.

* * * * *